United States Patent
Miao

(10) Patent No.: US 9,035,534 B2
(45) Date of Patent: *May 19, 2015

(54) VORTEX ALIGNMENT BUCKYPAPER GENERATING ELECTRICITY

(76) Inventor: Hsin Yuan Miao, Taichung (TW)

( * ) Notice: Subject to any disclaimer, the term of this patent is extended or adjusted under 35 U.S.C. 154(b) by 637 days.

This patent is subject to a terminal disclaimer.

(21) Appl. No.: 13/401,598

(22) Filed: Feb. 21, 2012

(65) Prior Publication Data

US 2013/0214638 A1    Aug. 22, 2013

(51) Int. Cl.
*H02N 11/00* (2006.01)
*B82Y 99/00* (2011.01)
*H01L 35/28* (2006.01)

(52) U.S. Cl.
CPC ............ *H02N 11/002* (2013.01); *H02N 11/008* (2013.01); *B82Y 99/00* (2013.01); *Y10S 977/948* (2013.01); *Y10S 977/953* (2013.01); *H01L 35/28* (2013.01); *B32B 2262/106* (2013.01)

(58) Field of Classification Search
CPC ......... H02N 11/002; H02N 6/00; H02N 3/00; H02N 11/008; B82Y 99/00; Y10S 977/948; Y10S 977/955; Y10S 977/954; Y10S 977/953; Y10S 977/96; B32B 9/007; H01L 35/28
See application file for complete search history.

(56) References Cited

U.S. PATENT DOCUMENTS 8,741,422 B2 *   6/2014   Miao .......................... 428/195.1
8,741,423 B2 *   6/2014   Miao .......................... 428/195.1

OTHER PUBLICATIONS

A. Rogalski, Infrared Detectors, 2010, CRC Press, Second Edition, Ch. 5, pp. 88-103 (Thermopiles).*
L.I. Anatychuk & A.A. Pustovalov, "Thermoelectric Microgenerators with Isotope Heat Sources" in D.M. Rowe (ed.), Thermoelectrics Handbook: Micro to Nano, 2005, CRC Press, Ch. 53, § 53.4, pp. 53-6-53-14 (Thermopiles).*

* cited by examiner

*Primary Examiner* — Quyen Leung
*Assistant Examiner* — Mark R Carter
(74) *Attorney, Agent, or Firm* — Muncy, Geissler, Olds & Lowe, P.C.

(57) ABSTRACT

The electrical energy generating system of the present invention comprises a piece of alignment Buckypaper, an energy generator, a thin deposition and two contacts. The alignment Buckypaper is a thin sheet made from an aggregate of carbon nanotubes. The thin deposition is formed on at least one surface of the alignment Buckypaper by electrolysis to form a semimetal material. A contact is connected with the upper surface of the alignment Buckypaper and the other contact is connected with the lower surface of the alignment Buckypaper. In use, the energy generated by the generator is inputted to the alignment Buckypaper. The energy then ionizes the molecules contained in the alignment Buckypaper. The positive charges move to the upper contact and the negative charges move to the lower contact. Such electrical energy may then be fed to a load connected with the two contacts to do work on the load.

6 Claims, 11 Drawing Sheets

VORTEX ALIGNMENT BUCKYPAPER GENERATING ELECTRICITY

BACKGROUND OF THE INVENTION

1. Field of the Invention

The invention generally relates to an electrical energy generating system, which includes a piece of alignment Buckypaper which is provided with a deposition to form a semimetal material. More particularly, the invention relates to an electrical energy generating system in which electrical energy is generated through the input of energy to the alignment Buckypaper.

2. Description of the Prior Art

In the future, humanity may have to face of the problem of energy shortage. In fact, a certain percentage of energy is lost in the form of heat or waste energy. If such lost energy is utilized, it would undoubtedly benefit humanity.

If there is a change in magnetic field in a conductive material, a current in the shape of a vortex would be generated to resist such change according to the principles of physics.

The thermoelectric effect is the direct conversion of temperature differences to electric voltage and vice-versa in certain types of materials. A thermoelectric device creates a voltage when there is a different temperature on each side. Conversely, when a voltage is applied, a temperature difference is created. This thermoelectric device can be used to generate electricity, measure temperature, or change the temperature of objects. Because the direction of heating and cooling is determined by the polarity of the applied voltage, thermoelectric devices are efficient temperature controllers.

As of now, Eddy current has been used in some fields (such as in the braking system of rapid transit systems). However, it has not been used in the energy generation field through alignment Buckypaper.

In this invention, alignment Buckypaper is used as a medium in energy conversion. This invention is a novel development in the energy conversion and generation field.

SUMMARY OF THE INVENTION

An object of the present invention is to provide an electrical energy generating system through the input of energy to alignment Buckypaper, and Eddy current is generated in the alignment Buckypaper due to Faraday's law and thermoelectric effect.

Another object of the present invention is to provide alignment Buckypaper with vortex lines on its surfaces in which alignment Buckypaper made at a higher speed of a mixer (when a vacuum filter is also used) would have a lower resistance, a higher voltage, and carbon nanotubes may be formed into alignment Buckypaper in a more orderly manner.

The third object of the present invention is to provide an electrical energy generating system in which, as indicated by the empirical graphs showing how resistivity in the horizontal direction varies with temperature in Buckypaper as temperature increases, alignment Buckypaper made at a higher speed of a mixer would have carbon nanotubes arranged in a more orderly manner and have a lower resistance.

The fourth object of the present invention is to provide alignment Buckypaper, several pieces of which may be connected in series to be used as a thermoelectric battery through the thermoelectric effect if energy is inputted into the alignment Buckypaper.

To reach these objects, the electrical energy generating system of the present invention is disclosed. The electrical energy generating system of the present invention comprises alignment Buckypaper, an energy generator, at least a thin deposition, and two contacts. Alignment Buckypaper is a thin sheet made from an aggregate of carbon nanotubes. A plurality of vortex lines is formed on the Buckypaper via the vortex motion. The thin deposition is formed on at least one surface of the alignment Buckypaper by a chemical process (electrolysis). A contact is connected with the upper surface of the alignment Buckypaper and the other contacts connected with the lower surface of the alignment Buckypaper. In use, the alignment Buckypaper is placed near the energy generator and the energy generated by the energy generator is inputted to the alignment Buckypaper. The energy would ionize the molecules contained in the alignment Buckypaper. The positive charges would then move to the upper contact and the negative charges would move to the lower contact. Therefore, such electrical energy may be fed to a load connected with the two contacts to do work on the load.

BRIEF DESCRIPTION OF THE DRAWINGS

The drawings disclose several illustrative embodiments of the present invention which serve to exemplify the various advantages and objects hereof, and are as follows.

DETAILED DESCRIPTION OF THE PREFERRED EMBODIMENTS

Figure 1:
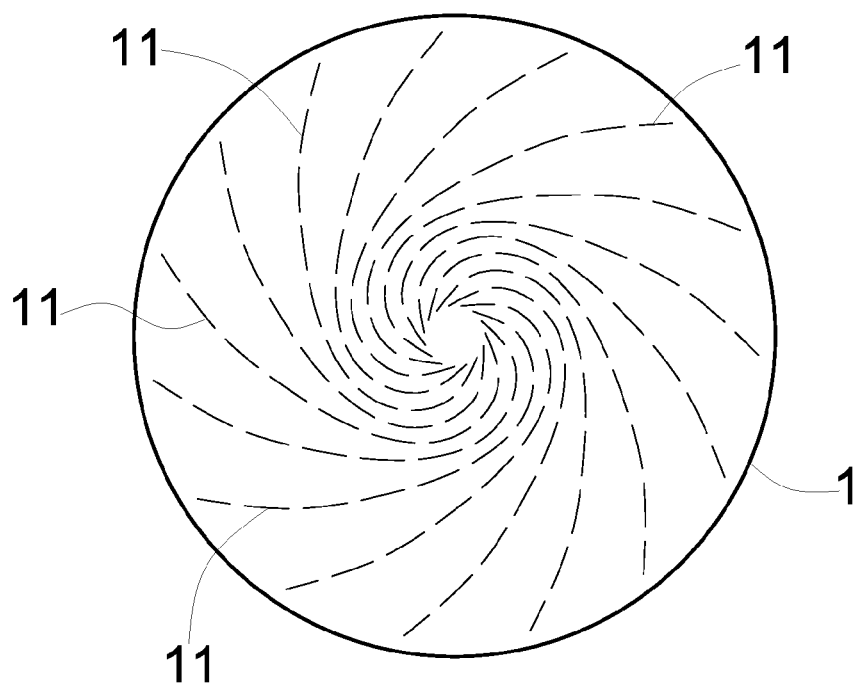
FIG. 1 is a top view illustrating the alignment Buckypaper of the present invention.
Figure 2:
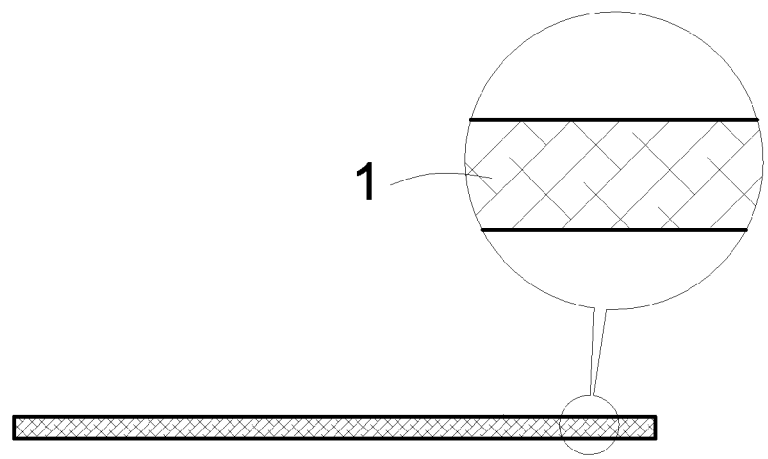
FIG. 2 is a sectional view and a partially enlarged view illustrating the alignment Buckypaper of FIG. 1.
Figure 3:
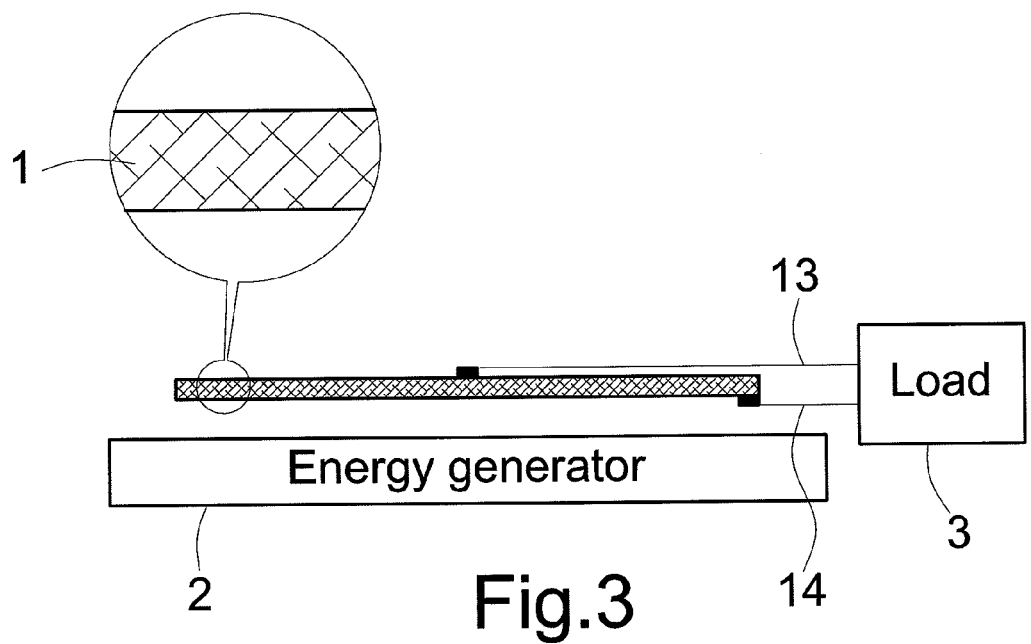
FIG. 3 is a view illustrating the first embodiment in the use of the electrical energy generating system of the present invention.

Please refer to FIGS. 1 to 3, which illustrate the electrical energy generating system of the present invention. The electrical energy generating system of the present invention comprises a piece of alignment Buckypaper 1, an energy generator 2, a thin deposition 12, an upper contact 13 and the lower contact 14. The alignment Buckypaper 1 is a thin sheet made from an aggregate of carbon nanotubes. In the electrical energy generating system of the present invention, electromagnetic energy or heat is applied onto a piece of alignment Buckypaper 1 to generate electrical energy. An energy generator 2 is placed near the alignment Buckypaper 1. A plurality of vortex lines 11 are formed on the alignment Buckypaper 1 via the vortex motion. An upper contact 13 is connected with the upper surface of the alignment Buckypaper 1 and the lower contact 14 is connected with the lower surface of the alignment Buckypaper 1. In use, first, the energy generated by the energy generator 2 is inputted to the alignment Buckypaper 1. Then, the energy ionizes the molecules contained in the alignment Buckypaper 1. The positive charges move to the upper contact 13 and the charges move to the lower contact 14. Therefore, such electrical energy may be fed to a load 3 connected with the two contacts 13 and 14 to do work on the load 3.

The alignment Buckypaper 1 used in the present invention is fabricated or prepared by the following steps:

Step 1: 0.03 g of carbon nanotubes and 3.0 g of the surfactant (Triton X-100) are placed into a beaker. 250 ml of distilled water is added into the beaker. The water is stirred to make it into a well mixed solution.

Step 2: The beaker with the solution is placed in a supersonic sonicator having an output power rating of 63 Watts for five minutes to scatter the carbon nanotubes and obtain a suspension.

Step 3: The suspension is stirred. More distilled water is added until the level of solution reaches 500 ml. The beaker is again placed with the solution in a supersonic sonicator having an output power rating of 63 Watts for 20 minutes to further scatter the carbon nanotubes.

Step 4: The suspension is stirred well. More distilled water is added until the level of solution reaches 900 ml. The beaker with the solution is again placed in a supersonic sonicator having an output power rating of 66 Watts for 30 minutes to further scatter the carbon nanotubes.

Step 5: The above four steps are repeated to obtain 10 sets of such suspension.

Step 6: A pump and a piece of filter paper are used to carry out the following

Step 7: One set of the suspension is poured onto a piece of filter paper under an atmospheric pressure of 10 m Torr through the use of the pump and the vacuum filter. The carbon nanotubes contained in the suspension may now deposit on the upper surface of the filter paper.

Step 8: If a mixer is used in the filtering process, a piece of the alignment Buckypaper 1 (ABP) used in the present invention will be obtained. If such mixer is not used in the filtering process, a piece of random Buckypaper 1 (RBP) will be obtained.

Step 9: The prototype Buckypaper 1 is submerged in isopropanol to remove the residual surfactant from the prototype Buckypaper 1.

Step 10: The prototype Buckypaper 1 is taken out of the isopropanol and then submerged in distilled water to remove the residual isopropanol from the prototype Buckypaper 1.

Step 11: The prototype Buckypaper 1 is allowed to dry naturally under one atmospheric pressure for more than 24 hours.

Step 12: The upper portion is separated from the filter paper.

Step 13: The upper portion is placed in an oven with an atmospheric pressure of 76 mm-Hg and a temperature of 120 degree C. to remove all of the residual water content.

Figure 9:
FIG. 9 is a photo of the alignment Buckypaper of the present invention.
Figure 10:
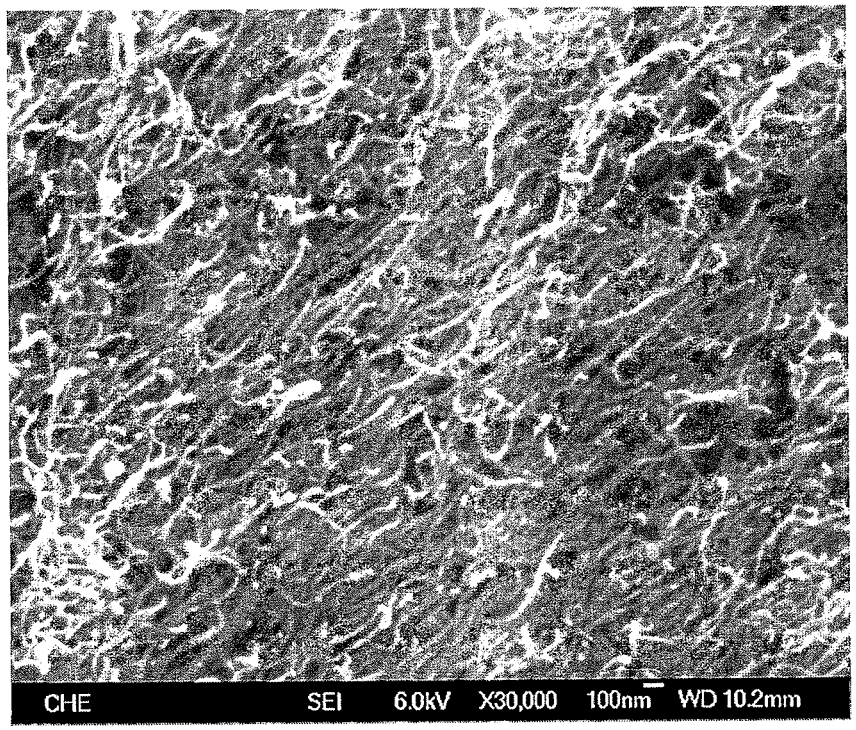
FIG. 10 is an SEM (scanning electron microscope) micrograph (taken with a magnification of 3,000×) of the alignment Buckypaper of the present invention to show its surface topography.

Step 14: Now, the upper portion obtained is a piece of the alignment Buckypaper 1 used in the present invention (as illustrated in FIG. 9 and FIG. 10). A plurality of vortex lines 11 are formed on either surface of such alignment Buckypaper 1.

In the aforesaid fabrication process, the vortex motion of the carbon nanotubes and the surfactant prompts the carbon nanotubes to collide with each other to form an intricate structure, which would remain unchanged when the alignment Buckypaper 1 is extended or compressed.

Figure 11:
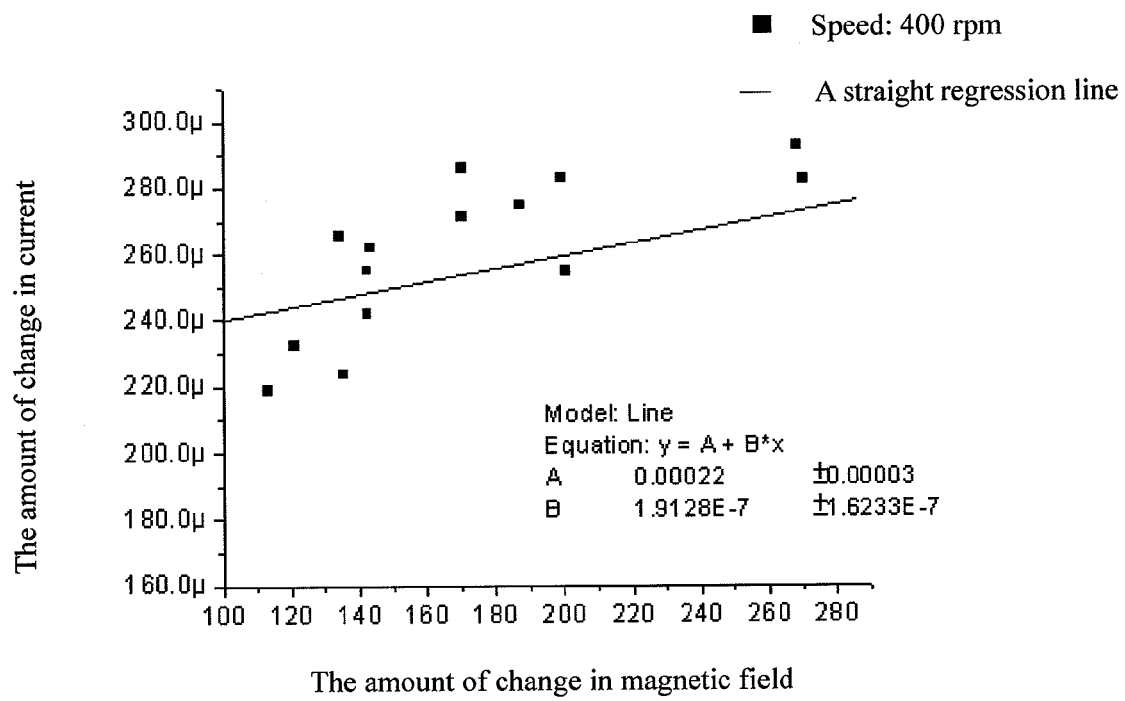
FIGS. 11, 12, and 13 are three graphs showing how the amount of change in electric current in the alignment Buckypaper varies with the amount of change in magnetic field in the alignment Buckypaper for the three types of alignment Buckypaper 1 made at three different speeds of the mixer, 400, 800 and 1200 rpm.
Figure 12:
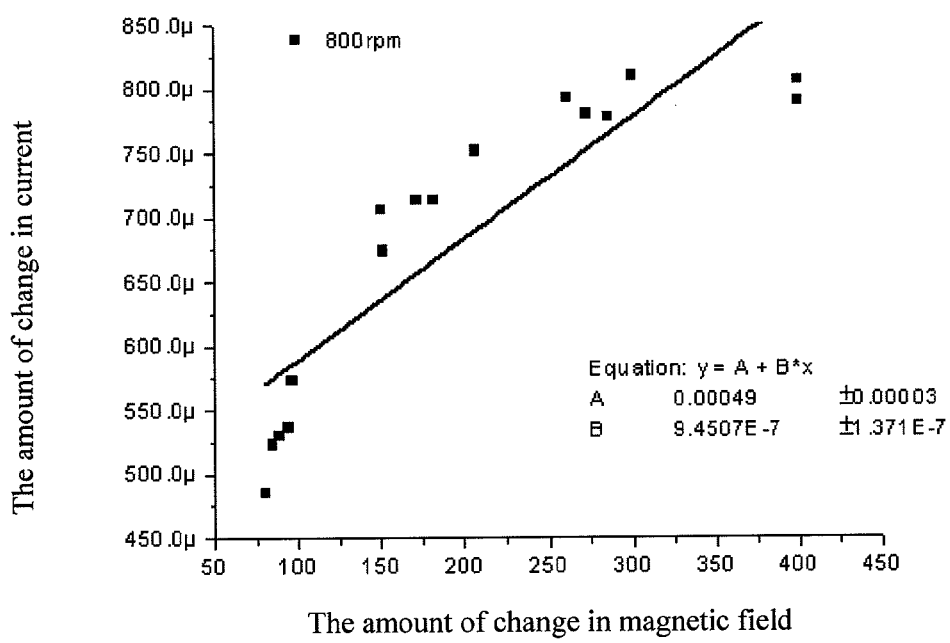
Figure 13:
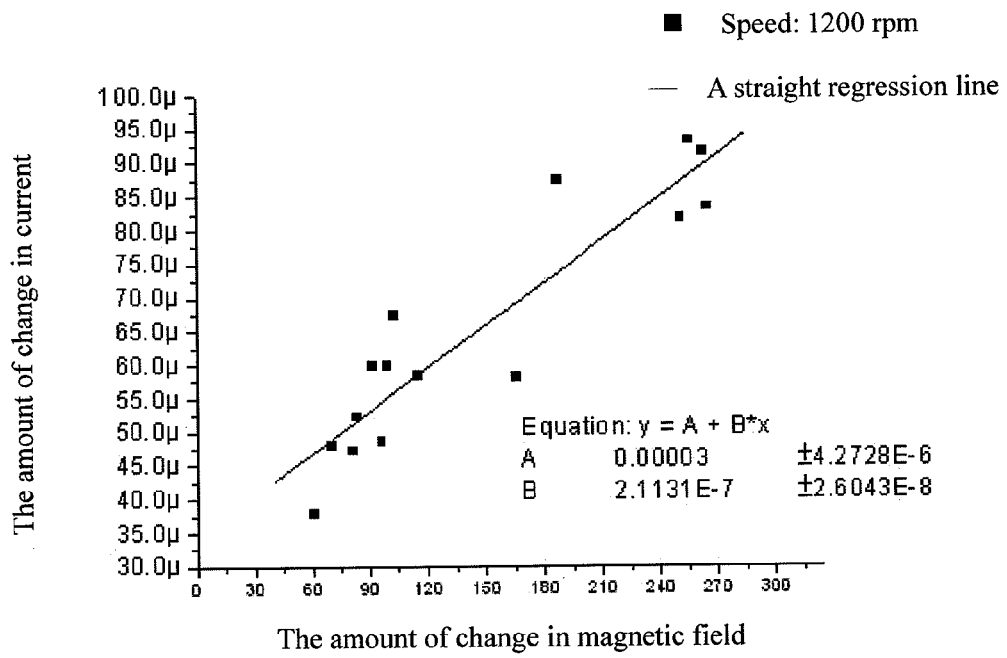

In the first embodiment of the present invention, the upper contact 13 is connected with the upper surface at its middle portion or end portion and the lower contact 14 is connected with the lower surface at its middle portion or end portion. As illustrated in FIG. 3, the upper contact 13 is connected with the upper surface at its middle portion and the lower contact 14 is connected with the lower surface at its end portion. FIGS. 11, 12, and 13 illustrate three graphs showing how the amount of change in electric current in the alignment Buckypaper 1 varies with respect to the amount of change in magnetic field in the alignment Buckypaper 1 for the three types of alignment Buckypaper 1 made or prepared at three different speeds of the mixer, 400, 800 and 1200 rpm.

Figure 4:
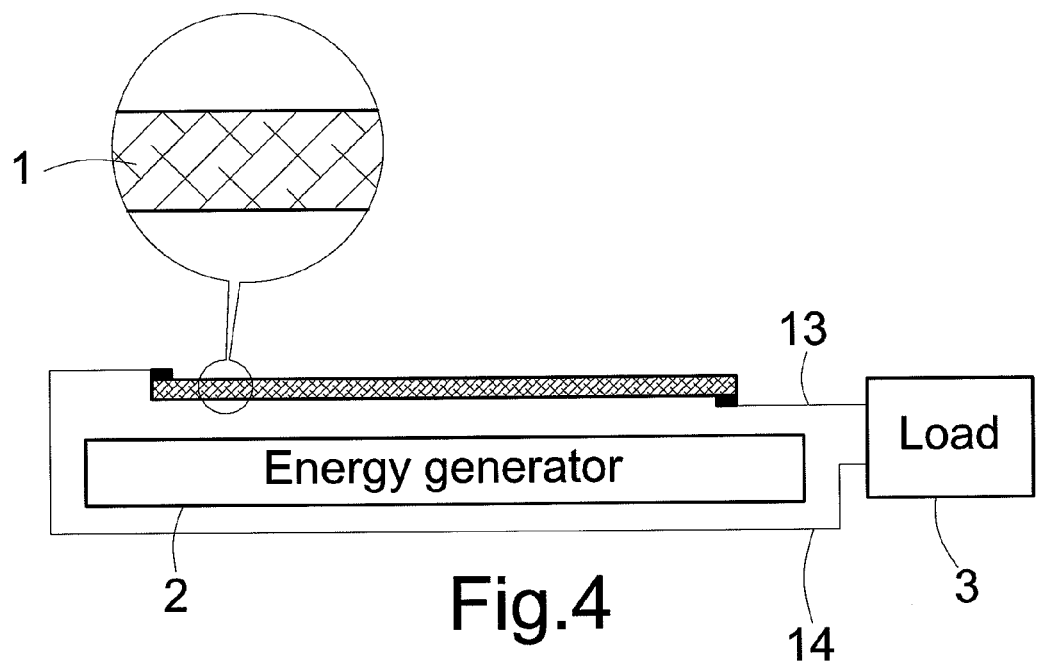
FIG. 4 is a view illustrating the second embodiment in the use of the electrical energy generating system of the present invention.
Figure 14:
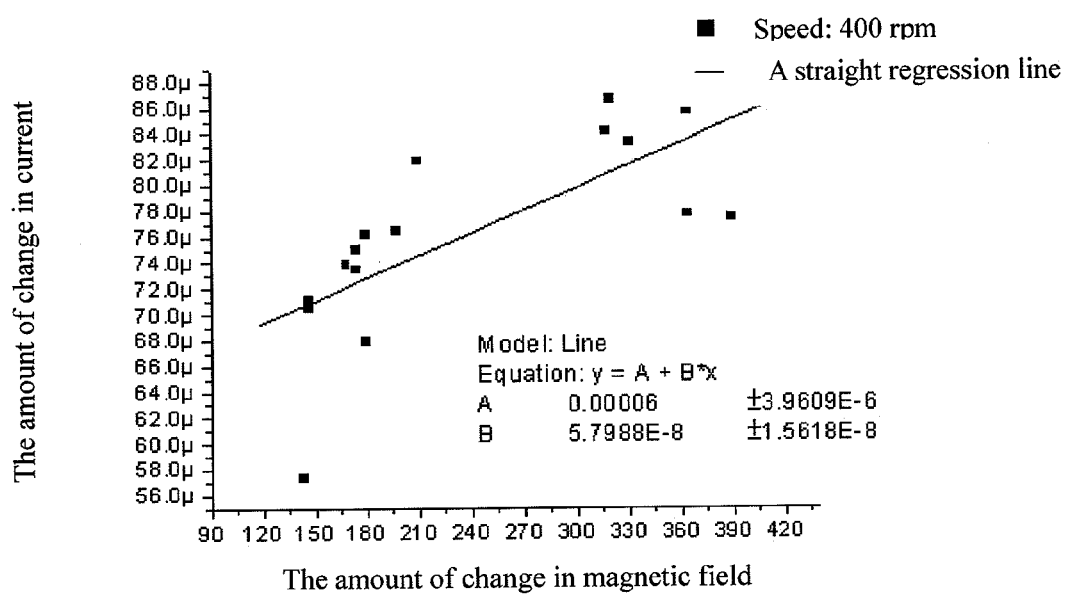
FIGS. 14, 15, and 16 shows how the amount of change in electric current in the alignment Buckypaper in FIG. 4 varies with the amount of change in magnetic field in the alignment Buckypaper for the three types of alignment Buckypaper 1 in FIG. 4 made at three different speeds of the mixer, 400, 800 and 1200 rpm.
Figure 15:
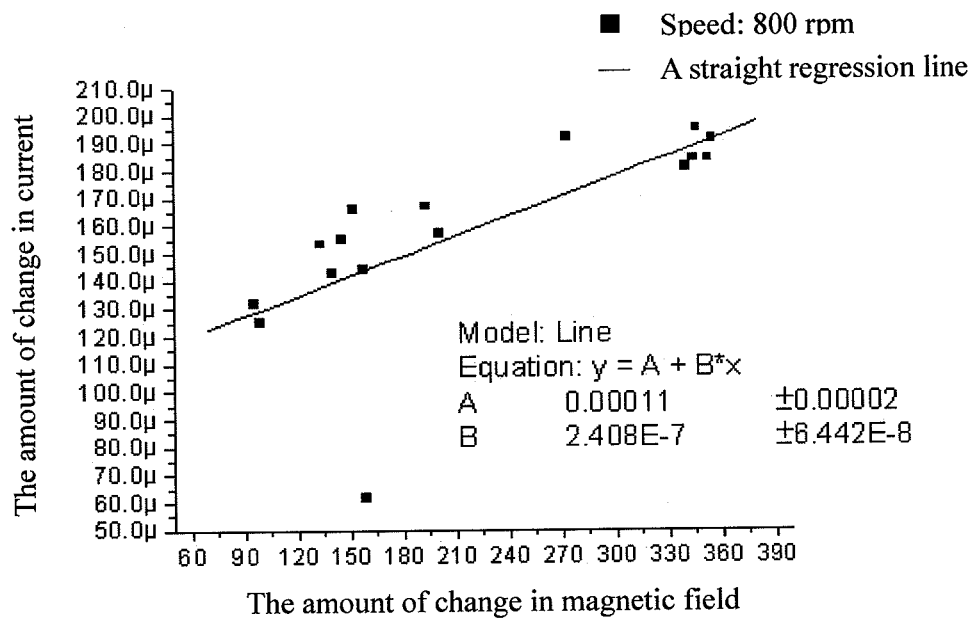
Figure 16:
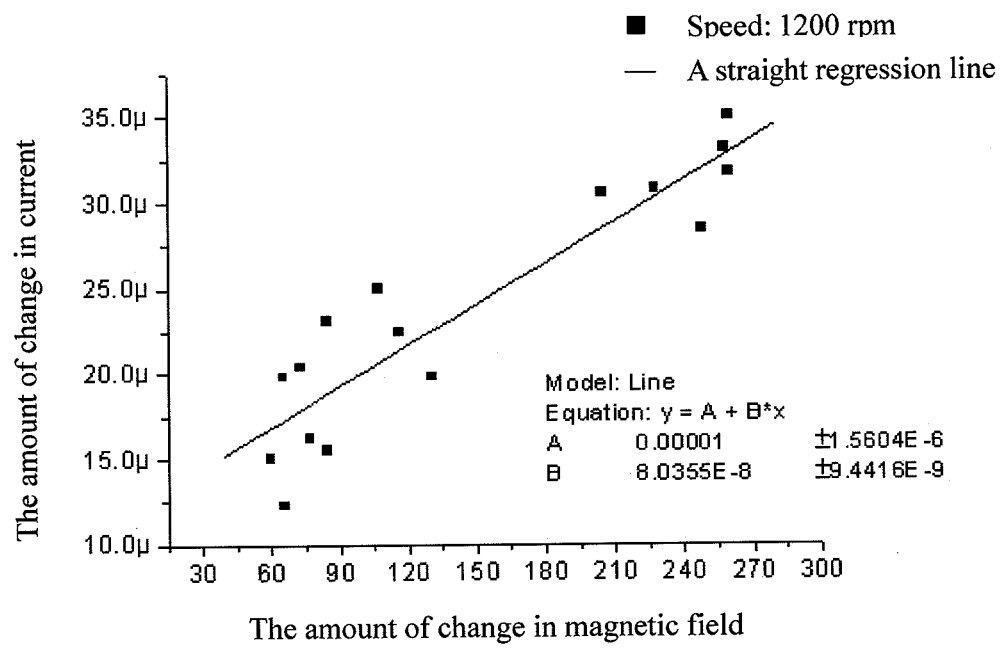

As illustrated in FIG. 4, the upper contact 13 is connected with the upper surface at its end portion and the lower contact 14 is connected with the lower surface at its end portion. FIGS. 14, 15, and 16 illustrate three graphs showing how the amount of change in electric current in the alignment Buckypaper 1 varies with respect to the amount of change in magnetic field in the alignment Buckypaper 1 for the three types of alignment Buckypaper 1 made or prepared at three different speeds of the mixer, 400, 800 and 1200 rpm.

Figure 5:
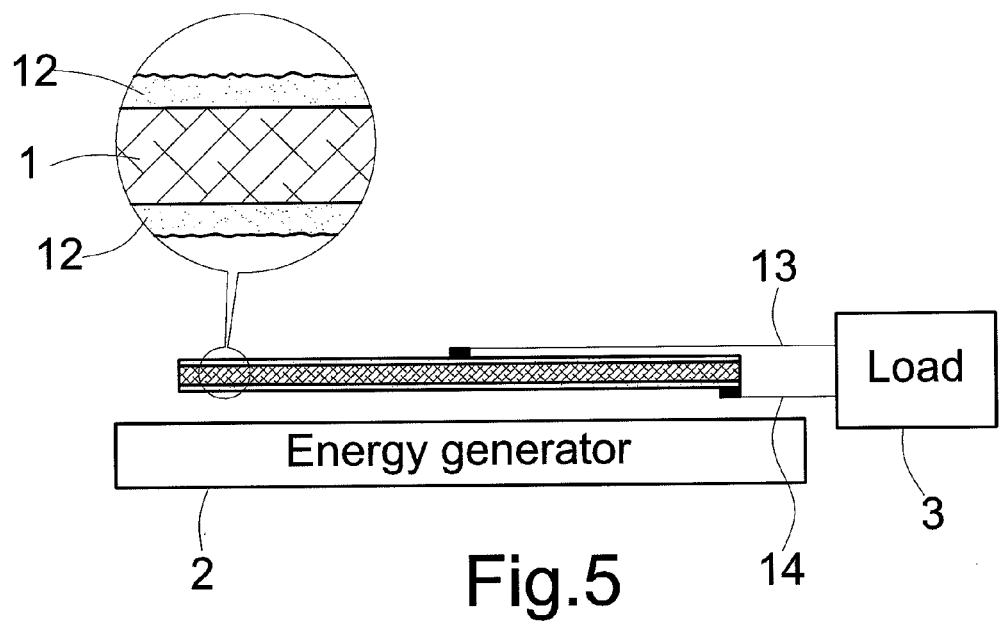
FIG. 5 is similar to FIG. 3, except that a thin deposition is provided on at least one surface of the alignment Buckypaper to form a semimetal material.
Figure 6:
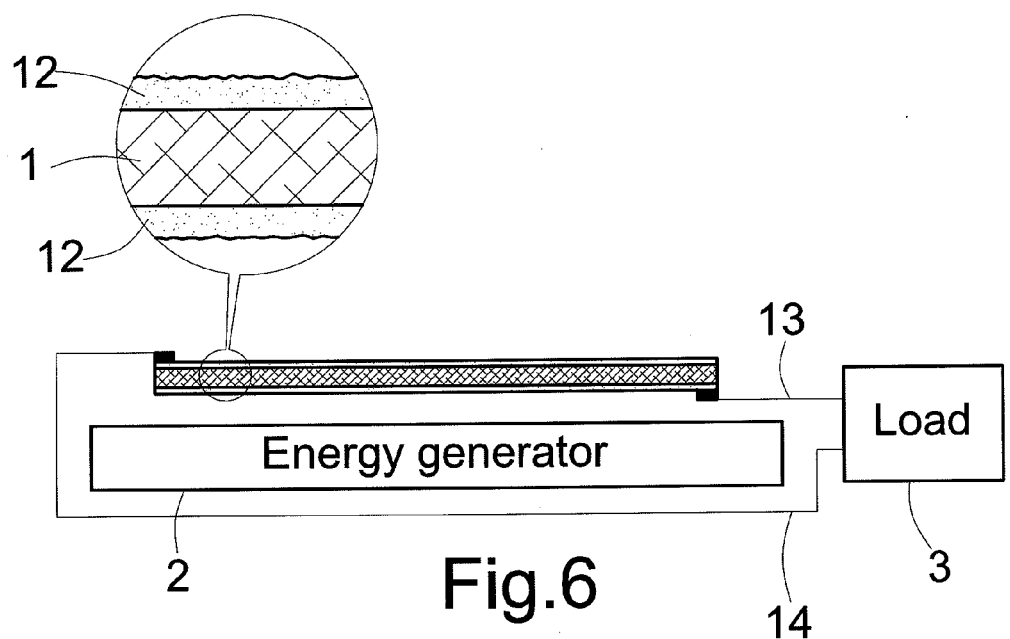
FIG. 6 is similar to FIG. 4, except that a thin deposition is provided on at least one surface of the alignment Buckypaper to form a semimetal material.
Figure 17:
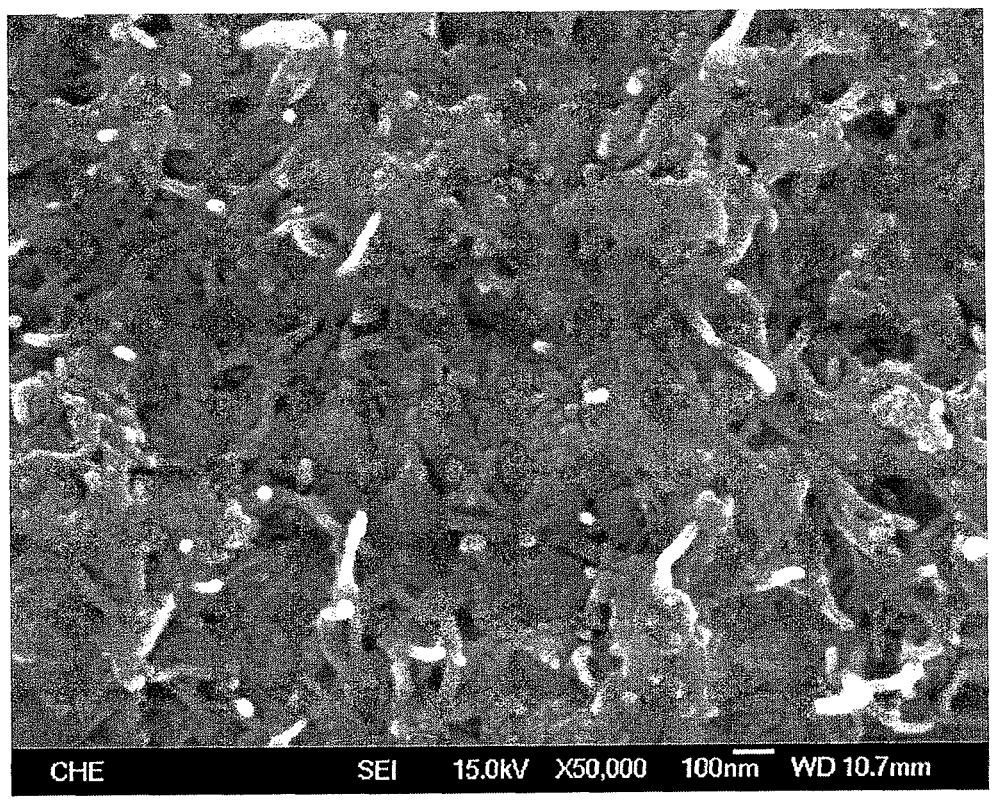
FIG. 17 is an SEM micrograph (taken with a magnification of 3000×) showing the surface of a thin layer provided on the alignment Buckypaper and indicating that, if the layer is made of two types of metals, the fine spaces between the carbon nanotubes may be more completely filled up by the metals so as to facilitate the propagation of electrons and to increase the amount of the Eddy current.

As illustrated in FIGS. 5 and 6, both the alignment Buckypaper 1 and the vortex lines appearing on either of its surfaces are formed through the vortex motion of carbon nanotubes. At least one surface of the alignment Buckypaper 1 is provided with a thin deposition 12 through a chemical process (plating). In addition, such thin deposition 12 is firmly attached to the alignment Buckypaper 1 and has physical properties that are quite different from those of the alignment Buckypaper 1. If electrolysis is used, the material to be coated on an item is used as the anode so as to be oxidized into positive ions to enter the electrolyte. The alignment Buckypaper 1 is used as the cathode and the positive ions are reduced at the surface of the alignment Buckypaper 1 to form the thin deposition 12 (please see FIG. 17). To keep other types of positive ions off and to ensure the evenness and firmness of the thin deposition 12, the electrolyte should be a solution of a chemical that is made of the same type of metal as the metal used as the anode.

In addition, the thin deposition 12 may be made of a single type of metal or two types of metals. If the layer 12 is made of two types of metals, the fine microscopic spaces between the carbon nanotubes may be more completely filled up by the metals so as to facilitate the propagation of electrons and to increase the amount of the vortex current.

The upper contact 13 is connected with the upper surface at its middle portion or end portion and the lower contact 14 is connected with the lower surface at its middle portion or end portion. Alternatively, as illustrated in FIG. 5, the upper contact 13 is connected with the upper surface at its middle portion and the lower contact 14 is connected with the lower surface at its end portion. Again, alternatively, as illustrated in FIG. 6, the upper contact 13 is connected with the upper surface at its end portion and the lower contact 14 is connected with the lower surface at its end portion.

The energy generator 2 may be an electromagnetic coil, a radio frequency heater or a high frequency oscillator.

If the energy generator 2 is an electromagnetic coil, an electromotive force (emf) will be generated or induced in the alignment Buckypaper 1 and will in turn generate induced current, which is a form of electrical energy and may do work on the load 3 through the upper contact 13 and the lower contact 14.

If the energy generator 2 is a radio frequency heater, the radio frequency heater will heat up the alignment Buckypaper 1 and the heat will generate vortex current (alternating current), which is a form of electrical energy and may do work on the load 3 through the upper electrode 13 and the lower contact 14.

If the energy generator 2 is a high frequency oscillator, heat will be generated from the energy loss of the high frequency oscillation. In addition, because the alignment Buckypaper 1 is sandwiched between the two metallic layers 12, a capacitor is formed. Induced magnetic field will be generated in such capacitor and will in turn generate vortex current (alternating current), which is a form of electrical energy and may do work on the load 3 through the upper contact 13 and the lower contact 14.

Figure 18:
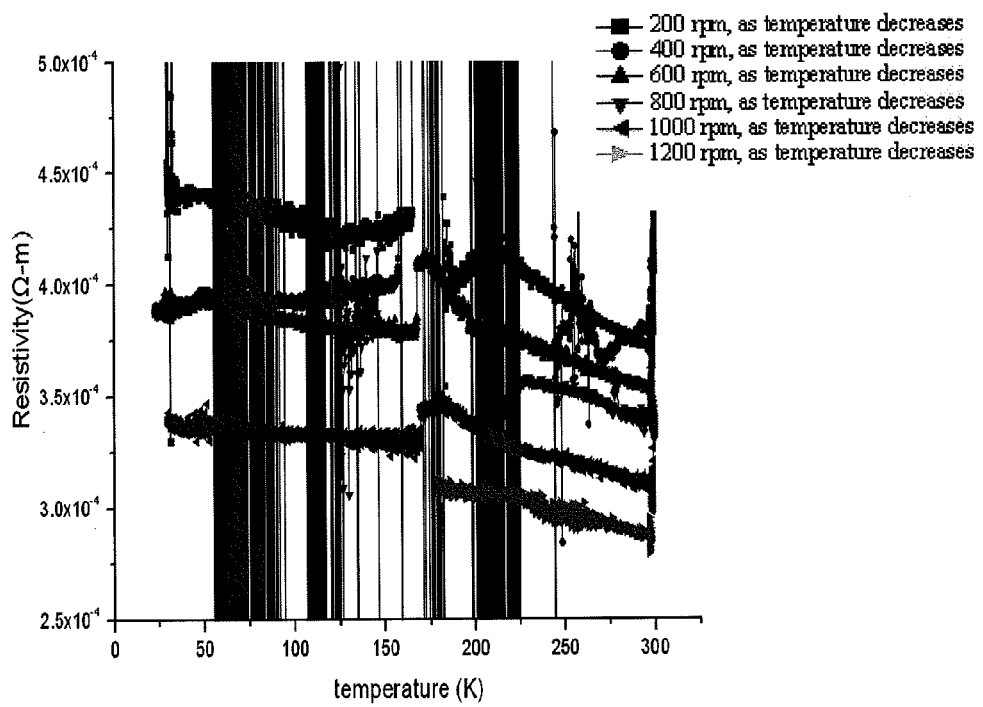
FIG. 18 shows how resistivity in the horizontal direction varies with temperature in the alignment Buckypaper as temperature decreases.
Figure 19:
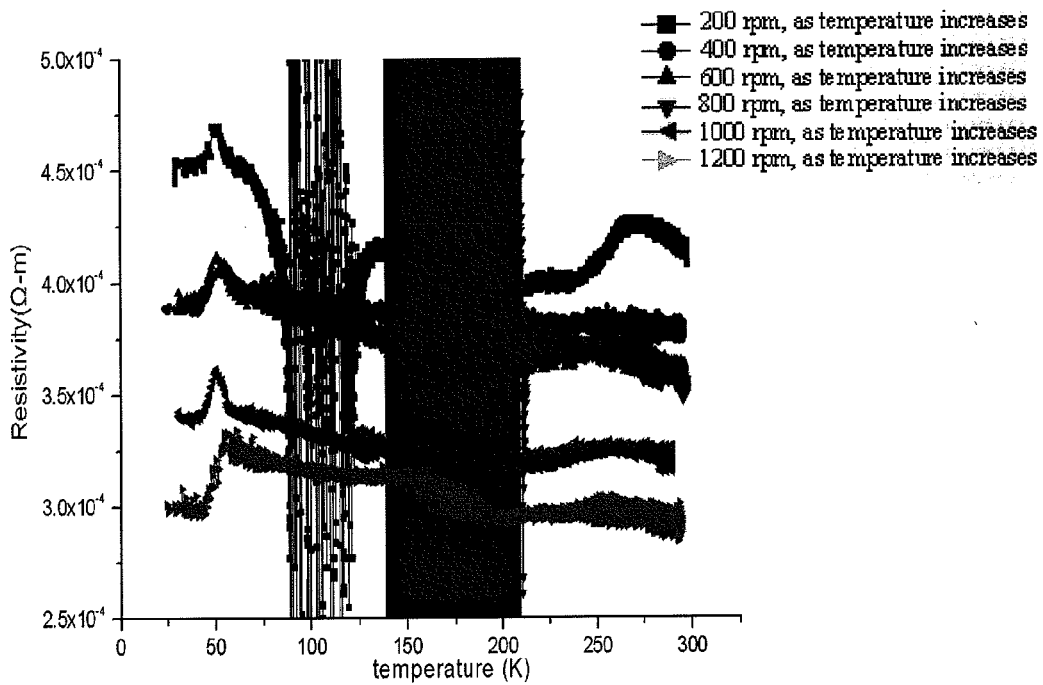
FIG. 19 shows how resistivity in the horizontal direction varies with temperature in the alignment Buckypaper as temperature increases.
Figure 20:
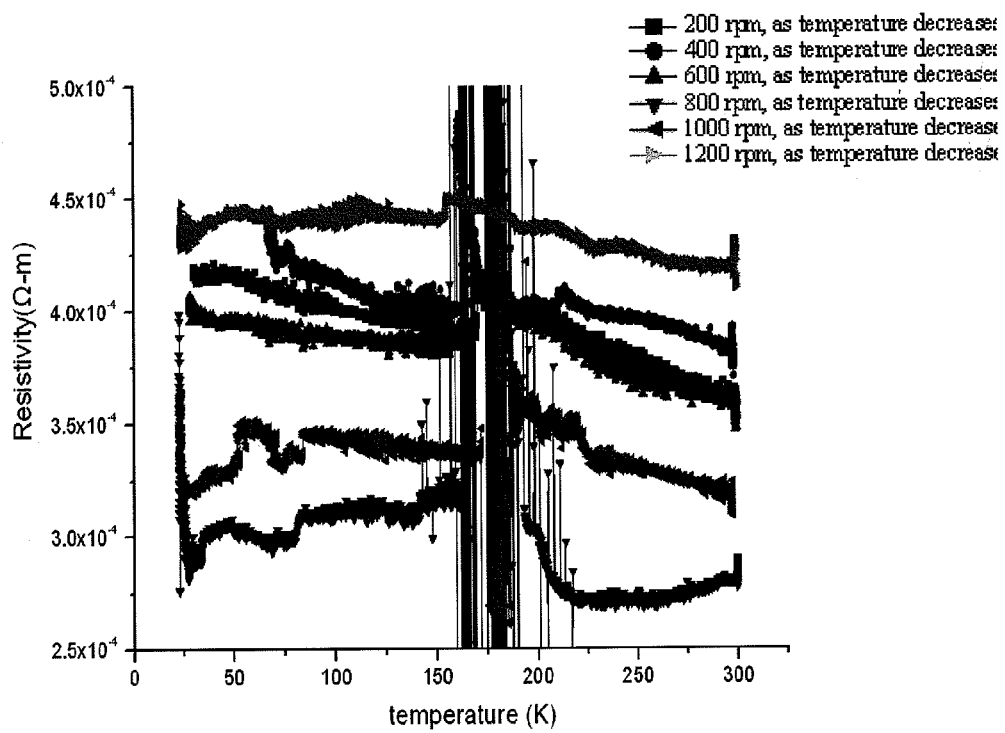
FIG. 20 shows how resistivity in the vertical direction varies with temperature in the alignment Buckypaper as temperature decreases.
Figure 21:
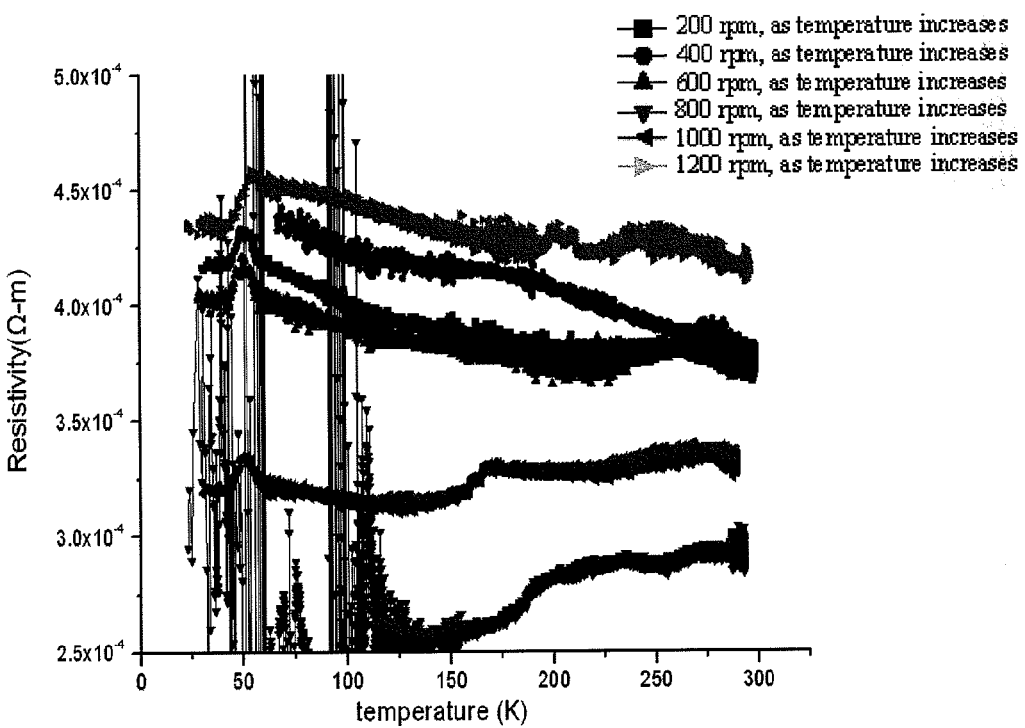
FIG. 21 shows how resistivity in the vertical direction varies with temperature in the alignment Buckypaper as temperature increases.

If a piece of alignment Buckypaper 1 is stacked up on top of another piece of alignment Buckypaper 1, greater vortex current may be obtained due to the increase in size. FIG. 18 shows how resistivity in the horizontal direction varies with respect to temperature in alignment Buckypaper 1 as temperature decreases. FIG. 19 shows how resistivity in the horizontal direction varies with temperature in alignment Buckypaper 1 as temperature increases. FIG. 20 shows how resistivity in the vertical direction varies with temperature in alignment Buckypaper 1 as temperature decreases. FIG. 21 shows how resistivity in the vertical direction varies with temperature in alignment Buckypaper 1 as temperature increases. With such two pieces of alignment Buckypaper 1, a small change (about 50 mT (microteslas)) in the magnetic field of the energy generator 2 would result in the generation of vortex current that is in the order of mA. With regard to five pieces of alignment Buckypaper 1 stacked up on each other, a change of 400 mT in the magnetic field of the energy generator 2 would result in the generation of about 4 mA of vortex current.

Figure 7:
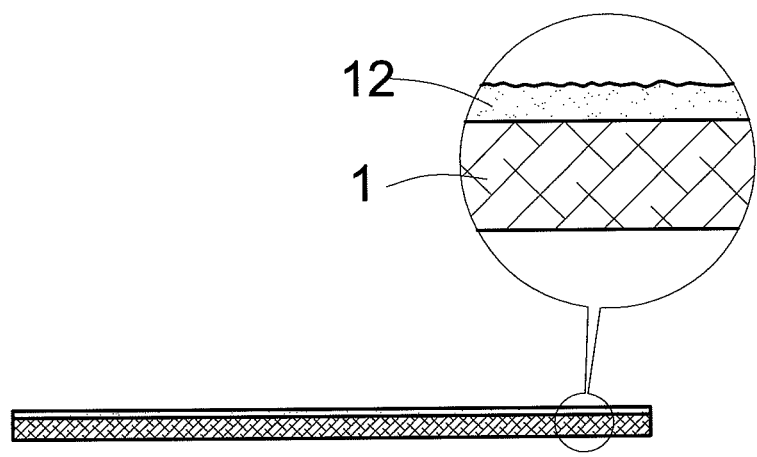
FIG. 7 is a sectional view and a partially enlarged view illustrating the alignment Buckypaper with a thin deposition provided on its upper surface.

As illustrated in FIG. 7, at least a thin deposition 12 is provided on the alignment Buckypaper 1 through the PVD (physical vapor deposition). The PVD includes two types: evaporation and sputtering. In the method of evaporation, metal (such as Sb, Bi or Te) is heated to its melting point, at which point metallic vapor is generated and thus is used to form the thin deposition 12. In the method of sputtering, ions in vapor phase generated by plasma are used to bombard the contact, which is made of Sb, Bi or Te and thus may deposit on the contact to form a thin deposition 12.

Figure 8:
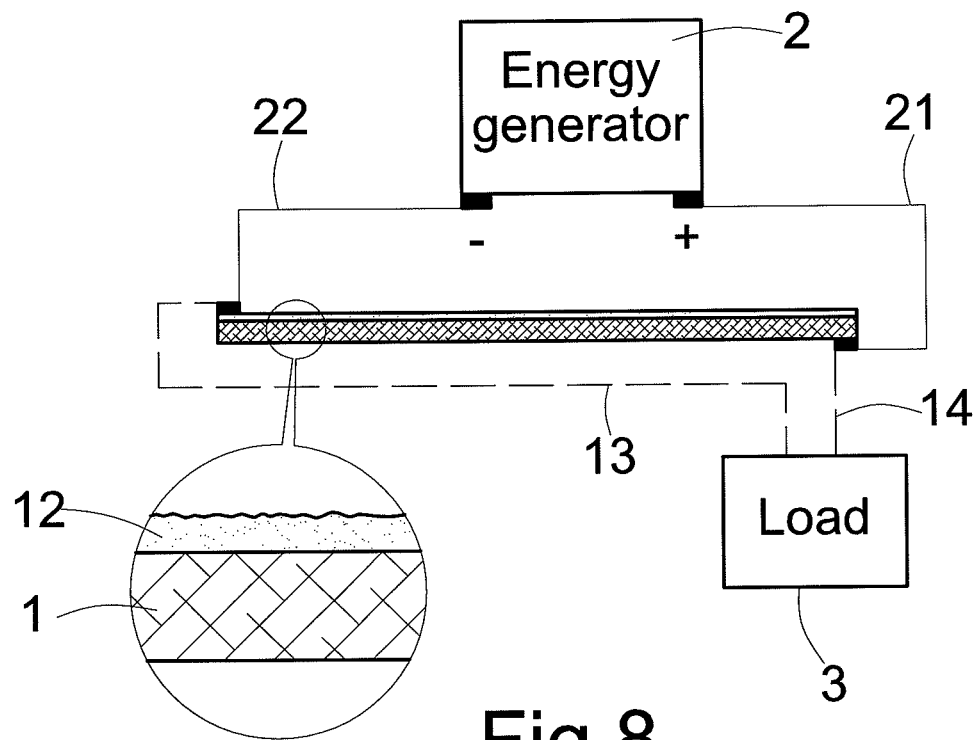
FIG. 8 is a view illustrating the third embodiment in the use of the electrical energy generating system of the present invention.

As illustrated in FIG. 8, the upper contact 13 is connected with the upper surface of the alignment Buckypaper 1 at its end portion and the lower contact 14 is connected with the lower surface at its end portion. In addition, the energy generator 2 is a thermopile generator or a thermoelectric device.

The cold connector 22 of a thermopile generator is connected with the thin layer 12 and the hot connector 21 of the thermopile generator is connected with the lower surface of the alignment Buckypaper 1. When the thermopile generator is turned on, the lower surface gets hot and the upper surface remains cold. This difference in temperature prompts the electrons contained in the alignment Buckypaper 1 to move and a voltage is hence generated. Such voltage may do work on a load 3 through the upper contact 13 and the lower contact 14. In addition, when such difference is greater than 150 degree C., a voltage may be generated.

The thermoelectric device may convert heat to electricity. The cold connector 22 of the thermoelectric device is connected with the thin deposition 12 and the hot connector 21 of the thermoelectric device is connected with the lower surface of the alignment Buckypaper 1. A closed loop is then formed and there is a difference in temperature between the two ends. An emf may be generated in the loop and such electrical energy may be outputted through the upper contact 13 and the lower contact 14. After the thermoelectric device is turned on, one end is hot and the other end is cold. This difference in temperature may generate a current in the alignment Buckypaper 1 and the magnitude of the current so generated increases as the difference in temperature increases. Moreover, the Peltier effect would assist the generation of such current due to the fact that the closed loop is made of two types of materials.

In addition, several pieces of alignment Buckypaper 1 may be connected in series. In such case, each piece of them would have the same difference in temperature and the same magnitude of vortex current is generated. Thus, the overall output power rating is "(the power rating of a single piece of alignment Buckypaper 1)×log(the number of pieces)".

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A system for generating electrical energy through the input of energy, comprising:
   a piece of alignment Buckypaper with vortex lines on its surfaces, wherein the piece of alignment Buckypaper and its vortex lines are formed through a vortex motion of carbon nanotubes;
   an energy generator, placed under or near the piece of alignment Buckypaper;
   an upper contact and a lower contact, wherein the upper contact is connected to an upper surface of the alignment Buckypaper and the lower contact is connected to a lower surface of the alignment Buckypaper,
   wherein energy generated by the energy generator is inputted to the alignment Buckypaper and ionizes the molecules contained in the alignment Buckypaper into positive charges and negative charges, wherein the positive charges move to the upper contact and the negative charges move to the lower contact.

2. The system for generating electrical energy as in claim 1, wherein a thin layer deposition is formed by deposition on a surface of the alignment Buckypaper through a chemical process to form a semimetal material.

3. The system for generating electrical energy as in claim 1, wherein the energy generator is an electromagnetic coil, which generates an alternating magnetic field, which generates induced Eddy current in the alignment Buckypaper, and wherein the induced Eddy current is outputted through the upper and lower contacts.

4. The system for generating electrical energy as in claim 1, wherein the energy generator is a radio frequency heater, which heats up the alignment Buckypaper, and wherein the radio frequency heater generates an electromagnetic field in the alignment Buckypaper and the electromagnetic field in turn generates Eddy current in the alignment Buckypaper, and wherein such Eddy current is outputted through the upper and lower contacts.

5. The system for generating electrical energy as in claim 1, wherein the energy generator is an oscillator, and wherein the energy loss of the oscillator is used for heating up the alignment Buckypaper, and wherein the alignment Buckypaper is sandwiched between two metallic layers to form a capacitor and hence an electromagnetic field is formed between the two metallic layers to generate current in the alignment Buckypaper, and wherein such current is outputted through the upper and lower contacts.

6. The system for generating electrical energy as in claim 2, wherein the chemical process is electrolysis.

\* \* \* \* \*